US005710072A

United States Patent [19]
Krautschneider et al.

[11] Patent Number: 5,710,072
[45] Date of Patent: Jan. 20, 1998

[54] METHOD OF PRODUCING AND ARRANGEMENT CONTAINING SELF-AMPLIFYING DYNAMIC MOS TRANSISTOR MEMORY CELLS

[75] Inventors: Wolfgang Krautschneider, Hohenthann; Lothar Risch, Neubiberg; Franz Hofmann, München, all of Germany

[73] Assignee: Siemens Aktiengesellschaft, Munich, Germany

[21] Appl. No.: 737,236

[22] PCT Filed: May 2, 1995

[86] PCT No.: PCT/EP95/01656

§ 371 Date: Nov. 18, 1996

§ 102(e) Date: Nov. 18, 1996

[87] PCT Pub. No.: WO95/31828

PCT Pub. Date: Nov. 23, 1995

[30] Foreign Application Priority Data

May 17, 1994 [DE] Germany ............... 44 17 150.1

[51] Int. Cl.⁶ ......................................... H01L 21/336
[52] U.S. Cl. ..................... 438/197; 438/270; 438/237
[58] Field of Search ................... 438/268, 270, 438/272, 237, 137, 138, 156, 157, 197

[56] References Cited

U.S. PATENT DOCUMENTS

| | | | |
|---|---|---|---|
| 4,670,768 | 6/1987 | Sunami et al. | 438/268 |
| 4,788,158 | 11/1988 | Chatterjee . | |
| 4,989,055 | 1/1991 | Redwine . | |
| 4,999,811 | 3/1991 | Banerjee . | |
| 5,164,325 | 11/1992 | Cogan et al. | 438/270 |
| 5,327,374 | 7/1994 | Krautschneider et al. . | |
| 5,330,927 | 7/1994 | Lee | 438/270 |
| 5,443,992 | 8/1995 | Risch et al. | 438/270 |

FOREIGN PATENT DOCUMENTS

| | | |
|---|---|---|
| 0 098 111 | 1/1984 | European Pat. Off. . |
| WO 92/01287 | 10/1986 | European Pat. Off. . |
| WO 92/01287 | 1/1992 | WIPO . |

OTHER PUBLICATIONS

T. Tsuchiya et al., "New Dynamic Ram Cell for VLSI Memeroies", IEEE Electron Device Letters, vol., EDL-3, 1982, 4 pages.

T. Tscuhiya et al., "Miniaturization Degree of Dynamic MOS Ram Cells with Readout Signal Gain", IEEE Transactions on Electron Devices, Vool., Ed-29, No. 11 1982, pp. 1713–1717.

K. Terada et al., "A New VLSI Memory Cell Using DMOS Technology (DMOS Cell)", IEEE Transactions on Electron Devices, vol., ED-29, No. 8, 1982, pp. 1301–1308.

T. Blalock et al., "A Nevel 8 ns 2T Dram Cell Topology with Non–Destructive Readout Utilizing a Clamped Bit Line CMOS Sense Amplifier", Memory/Emerging Technology.

(List continued on next page.)

*Primary Examiner*—Tuan H. Nguyen
*Attorney, Agent, or Firm*—Hill, Steadman & Simpson

[57] ABSTRACT

To produce an arrangement containing self-amplifying dynamic MOS transistor memory cells which each comprise a selection transistor, a memory transistor and a diode structure, the selection transistor and the memory transistor being connected in series via a common nodal point and the diode structure being connected between the common nodal point and the gate electrode (10) of the memory transistor, the selection transistor and the memory transistor are formed as vertical MOS transistors. For this purpose a vertical sequence of suitably doped zones (2, 3, 4) in which trenches (5, 6) are produced and which are provided with gate dielectric (7, 8) and gate electrode (9, 10) is produced, in particular, by LPCVD epitaxy or by molecular-beam epitaxy.

10 Claims, 3 Drawing Sheets

OTHER PUBLICATIONS

K. Sunouchi et al., "A Self-Amplifying (SEA) Cell for Future high Density Drams", IEDM Tech., Dig. 1991, pp. 17.1.1–17.1.4.

Krautschneider et al., "Fully Scalable Gain Memory Cell for Future Drams", Microelectronic Engineering, 1991, pp. 367–370.

IBM Technical Disclosure Bulletin, vol., 34, No. 6, Nov. 1991, "Common–Wordline Compact Merged Dram Cell", pp. 231–233.

Japanese Abstract, "Semiconductor Storage Device", vol. 14, No. 105, 1990 1–307256, Dec. 12, 1989.

Japanese Abstract, "Semiconductor Storage Device and Manufacture Thereof", vol. 14, No. 205, 1990, 2–44763, Feb. 14, 1990.

METHOD OF PRODUCING AND ARRANGEMENT CONTAINING SELF-AMPLIFYING DYNAMIC MOS TRANSISTOR MEMORY CELLS

BACKGROUND OF THE INVENTION

1. Field of the Invention

The present invention relates generally to a method produce an arrangement containing self-amplifying dynamic MOS transistor memory cells which each comprise a selection transistor, a memory transistor and a diode structure.

2. Description of the Related Art

With increasing storage density per chip from one memory generation to the next, the area of dynamic semiconductor memory cells is being continuously reduced. For this purpose, from the 4 Mbit memory generation onwards, three-dimensional structures are necessary. From the 64 Mbit memory generation onwards, the memory capacity has reached a value which can hardly still be reduced, with the result that an approximately constant capacity has to be formed on a reduced cell area. This results in an appreciable technological expenditure. It is therefore necessary to impose on an improved dynamic semiconductor memory cell the requirement that the level of the signal charge is not determined by the size of the memory capacity.

This requirement is fulfilled by memory cells in which the signal charge is provided not by a storage capacitor but by a supply-voltage source. In this case, it is sufficient to store in the storage capacitor only a smaller charge which, when the memory cell is read out, activates a switching element so that a conducting connection is made between the supply-voltage source and the bit line. Such memory cells are referred to as self-amplifying memory cells or gain memory cells.

The publication by T. Tsuchiya et al., IEEE Electr. Dev. Lett. (1982), EDL-3, page 7 and T. Tsuchiya et al., IEEE Trans. Electr. Dev. (1982), ED-29, page 1713, disclose a self-amplifying memory cell containing a barrier-layer field-effect transistor. In this type of memory cell, the stored charge controls the extent of a space-charge zone of a p-n junction. If the cell is charged, the space-charge zone is enlarged to such an extent that it constricts the current channel between voltage source and bit line. If, on the other hand, no charge is stored in the cell, the current channel is not constricted and current is able to flow from the voltage source to the bit line. In this type of cell, the semiconductor region forming the p-n junction and the current channel can only have low tolerances so as to ensure both adequate current flow and also reliable blocking during corresponding charging. In addition, an additional line is needed to write the information.

The publication by K. Terada et al., IEEE Trans. Electr. Dev. (1982), ED-29, page 1301, discloses a self-amplifying memory cell containing a DMOS transistor. In this case, a planar MOS transistor and a DMOS transistor are integrated with one another. The charge representing the information is stored in the substrate of the DMOS transistor. Depending on the charging state of the substrate, the DMOS transistor assumes two different threshold voltages. In this type of cell, positive and negative voltages are necessary on the word line. Furthermore, the levels must be adjusted very precisely in order to be able to differentiate between a logic "zero" and "one" during reading-out.

The publication by T. N. Blalock et al., Symp. VLSI Circuits Dig. Tech. Pap. (1990), page 13, discloses a two-transistor memory cell which has been developed from the three-transistor cell and in which the third transistor, which is used to read out, is omitted. Instead, the state of the memory transistor is scanned by lines arranged in matrix fashion. This type of cell requires four lines, which have to be routed over the cell array in the form of a double matrix. Four contacts are necessary for each cell, which limits the reduction in the cell area. Furthermore, the source and drain regions of the two transistors cannot be formed by a common doped zone, as would be necessary for a small cell area.

A self-amplifying memory cell containing an MOS transistor and a bipolar transistor is disclosed, for example, by K. Sunouchi et al., in the publication IEDM Tech. Dig. (1991), page 465. In this memory cell, the amplifying action of a parasitic bipolar transistor is exploited. As a result, the required capacity of the storage capacitor can be reduced appreciably. Since the bipolar transistor is a parasitic element, it cannot be formed with the reproducibility required for memory cells. The integration of a bipolar transistor in the memory cell with minimum design rules would result in a comparatively large cell area.

The international published patent application WO 92/012887 and the publication by W. H. Krautschneider et al., Proc. ESSDERC (1991), page 367, disclose a self-amplifying dynamic MOS transistor memory cell which comprises a selection transistor and a memory transistor. In this memory cell, the charge is stored in the gate capacitance and source capacitance of the memory transistor. The two transistors are connected in series and have a common drain/source zone. The common drain/source zone is connected to the gate electrode of the memory transistor via a diode structure. During reading-out, the memory transistor is turned on in accordance with the stored information and thereby closes a current path from the supply voltage to the bit line. In this type of cell, selection transistor and memory transistor are connected in series so that a special line is not required to read out the signal.

SUMMARY OF THE INVENTION

The present invention is based on the problem of providing a method of producing an arrangement containing self-amplifying dynamic MOS transistor memory cells, with which method the area of the memory cells can be reduced further.

According to the invention, this problem is solved by a method in which an arrangement containing self-amplifying dynamic MOS transistor memory cells is produced,

- in which a silicon substrate is provided with a vertical sequence of doped zones which comprises at least a first doped zone, a second doped zone disposed thereon and a third doped zone disposed thereon for source zone, channel zone and drain zone of vertical MOS transistors,
- in which a first trench and a second trench are etched which extend down into the first zone and which traverse the second zone and the third zone,
- in which the surface of the first trench is provided with a first gate dielectric and the surface of the second trench is provided with a second gate dielectric,
- in which a first gate electrode is formed in the first trench and a second gate electrode is formed in the second trench,
- in which a third trench which cuts through the first doped zone, the second doped zone and the third doped zone is produced between the first trench and the second trench, in which the third trench is provided with a first isolation structure at least in the region of the first doped zone and of the second doped zone, in which those parts of the third doped zone that are separated by the third trench are electrically interconnected by an interconnect structure, in which a diode structure is produced whose one terminal is connected in an electrically conducting manner to the third doped zone and whose other terminal is connected in an electrically conducting manner to that of the second gate electrode. Further developments of the invention provide that the silicon substrate is doped with a first conductivity type, a silicon layer doped with a second conductivity type opposite to the first is grown epitaxially on the silicon substrate to form the first doped zone, a silicon layer doped with the first conductivity type is applied by LPCVD epitaxy or by molecular-beam epitaxy to form the second doped zone, and a silicon layer doped with the second conductivity type is applied by LPCVD epitaxy or by molecular-beam epitaxy to form the third doped zone. Preferably, the diode structure is formed as a Schottky diode. The diode structure may be formed as an n+-p diode.

In one embodiment, the second gate electrode is formed from doped polysilicon, a doped polysilicon structure is produced which, with the second gate electrode, is the diode structure, and the doped polysilicon structure is connected in an electrically conducting manner to the third doped zone.

The further detail, the second gate electrode is produced in the second trench in a height essentially corresponding to the level of the second doped zone, the doped polysilicon structure is produced in the second trench above the second gate electrode, the surface of the doped polysilicon structure is provided with a metal silicide layer, a doped polysilicon strip is produced in which the metal silicide layer and the third doped zone overlap at least partly in each case.

A preferred method provides that a diffusion-barrier layer is produced between the second gate electrode and the doped polysilicon structure.

The dopant concentration in the first doped zone and in the third doped zone is adjusted in the range greater than or equal to $10^{19}$ cm$^{-3}$, the dopant concentration in the second doped zone is adjusted in the range less than or equal to $10^{18}$ cm$^{-3}$, and the first gate dielectric and the second gate dielectric are formed by thermal oxidation at 700° to 800° C.

The interconnect structure may be formed by means of the third trench composed of doped polysilicon of the same conductivity type as the third doped zone.

A multiplicity of memory cells are disposed in matrix fashion in the silicon substrate, the first trench, the second trench and the third trench are each formed as parallel strips, there is produced, inside the first trench, a fourth trench which cuts through the first doped zone and in which a second isolation structure is formed which isolates at least the parts of the first doped zone on either side of the fourth trench from one another, there is produced, inside the second trench, a fifth trench which cuts through the first doped zone and in which a third isolation structure is formed which isolates the parts of the first doped zone, the second gate electrode and the diode structure on either side of the fifth trench from one another, sixth trenches are produced which cross the first trenches, the second trenches and third trenches, which extend down into the first doped zone without cutting through the first doped zone and which are filled with fourth isolation structures, word lines are produced which extend parallel to the sixth trenches and which are connected in an electrically conducting manner to the first gate electrodes via word-line contacts, adjacent memory cells are arranged in a mirror-symmetrical manner along a word line, and in each case, that part of the first doped zone that is disposed between the first trench and the third trench is connected as bit line and that part of the first doped zone that is disposed between the third trench and the second trench is connected as supply-voltage line.

In the method according to the invention, a silicon substrate is provided with a vertical sequence of doped zones which comprises at least a first doped zone, a second doped zone and a third doped zone for source zone, channel zone and drain zone of vertical MOS transistors. In the vertical sequence of doped zones, a selection transistor and a memory transistor are formed by etching trenches which extend in each case down into the first zone and by providing the surface of the trenches with a gate dielectric and a gate electrode in each case.

A further trench which cuts through the first doped zone, the second doped zone and the third doped zone is produced between the two trenches. An isolation structure which separates the first doped zone and the second doped zone into two parts which are isolated from one another in each case is formed in the trench. Those parts of the third doped zone that are separated by the further trench are electrically interconnected by an interconnect structure.

A diode structure is produced with one terminal is connected in an electrically conducting manner to the third doped zone and another terminal connected in an electrically conducting manner to one of the gate electrodes.

In this arrangement, the memory transistor is formed by the first doped zone, the second doped zone, the third doped zone and the gate electrode connected to the diode structure. The selection transistor is formed by the other gate electrode, the first doped zone, the second doped zone and the third doped zone. The third doped zone, together with the interconnect structure, forms the common source/drain zone of the selection transistor and the memory transistor. The diode structure is dimensioned in such a way that a relatively high current flow occurs during charging and a relatively low current flow occurs when the capacitance which is active at the gate electrode of the memory transistor discharges.

In a matrix-type arrangement of a multiplicity of memory cells, that part of the first doped zone that belongs to the selection transistor forms a bit line, while that part of the first doped zone that belongs to the memory transistor forms a supply-voltage line. Both the bit line and the supply-voltage line are buried in the structure and do not need any additional area.

In the matrix-type arrangement of the memory cells, word lines, which cross the bit lines and the supply-voltage lines, are produced on the surface of the structure. Adjacent memory cells along a word line are preferably of a mirror-symmetrical design, every two immediately adjacent memory cells having a common wordline contact.

Preferably, a silicon substrate is used which is doped with a first conductivity type. To form the first doped zone, a silicon layer that is doped with a second conductivity type opposite to the first is grown epitaxially thereon. To form the second doped zone, a silicon layer doped with the first conductivity type is applied by LPCVD epitaxy or by molecular-beam epitaxy. To form the third doped zone, a silicon layer doped with the second conductivity type is applied by LPCVD epitaxy or by molecular-beam epitaxy. LPCVD epitaxy is an abbreviation for low-pressure chemical vapour deposition.

It is within the scope of the invention to form the diode structure as a Schottky diode in such a way that a low resistance value occurs during charging and a high resistance value occurs when the capacitance active at the gate electrode discharges. For this purpose, the gate electrode is formed, for example, from doped polysilicon and a layer of a metal, for example aluminium, is deposited thereon.

Alternatively, the diode structure is formed as an $n^+$-p diode. For this purpose, the second gate electrode is preferably formed from doped polysilicon and is provided with a suitably doped polysilicon structure. The doped polysilicon structure and the gate electrode are the common diode structure. This embodiment is preferred with a view to integration in existing VLSI technologies. To simplify the subsequent contacting between the doped polysilicon structure and the third doped zone, it is within the scope of the invention to provide the surface of the doped polysilicon structure with a metal silicide layer. The metal silicide layer is preferably produced in a self-aligning process.

The dopant concentration in the first doped zone and in the third doped zone, which each form source/drain regions of the MOS transistors, is high, with a dopant concentration of more than $10^{19}$ cm$^{-3}$, while the dopant concentration in the second doped zone, which forms a channel zone, is adjusted to less than, or equal to $10^{18}$ cm$^{-3}$. To form the first and second gate dielectrics, a thermal oxidation is carried out at 700° to 800° C. In this process, the gate dielectric forms on the more heavily doped zones with a thickness which is a multiple of that of the more lightly doped zone used as a channel region. The greater thickness of the gate dielectric at the surface of the source/drain zones brings about a reduction in the overlap capacitances.

BRIEF DESCRIPTION OF THE DRAWINGS

The invention is explained in greater detail below by reference to an exemplary embodiment and the figures.

DETAILED DESCRIPTION OF THE PREFERRED EMBODIMENTS

Figure 1:
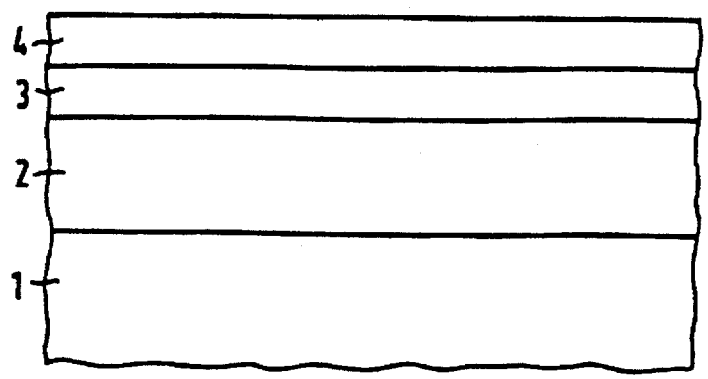
FIG. 1 is a side cross section which shows a silicon substrate containing a vertical sequence of doped zones.

An $n^+$-doped layer 2 having a dopant concentration of, for example, $3\times10^{19}$ cm$^{-3}$ is grown epitaxially on a silicon substrate 1 which is, for example, p-doped with a dopant concentration of $10^{16}$ cm$^{-3}$ (see FIG. 1). The first doped silicon layer 2 is applied in a thickness of, for example, 300 nm.

A second doped silicon layer 3 which is, for example, p-doped with a dopant concentration of $8\times10^{17}$ cm$^{-3}$ is applied to the first doped silicon layer 2 and a third doped silicon layer 4 which is, for example, $n^+$-doped with a dopant concentration of $3\times10^{19}$ cm$^{-3}$ is applied thereto. The second doped silicon layer 3 and the third doped silicon layer 4 are produced in a thickness of, in each case, approximately 150 nm with the aid of epitaxial methods such as LPCVD epitaxy or molecular-beam epitaxy. The LPCVD epitaxy (that is an abbreviation for low-pressure chemical vapour deposition) is carried out, for example, using silane and diborane or arsine in the temperature range from 700° to 900° C. and in the pressure range from 2 to 20 mbar. The molecular-beam epitaxy is preferably carried out in the temperature region of 520° C. and in the pressure region of $5\times10^{-10}$ mbar.

Figure 2:
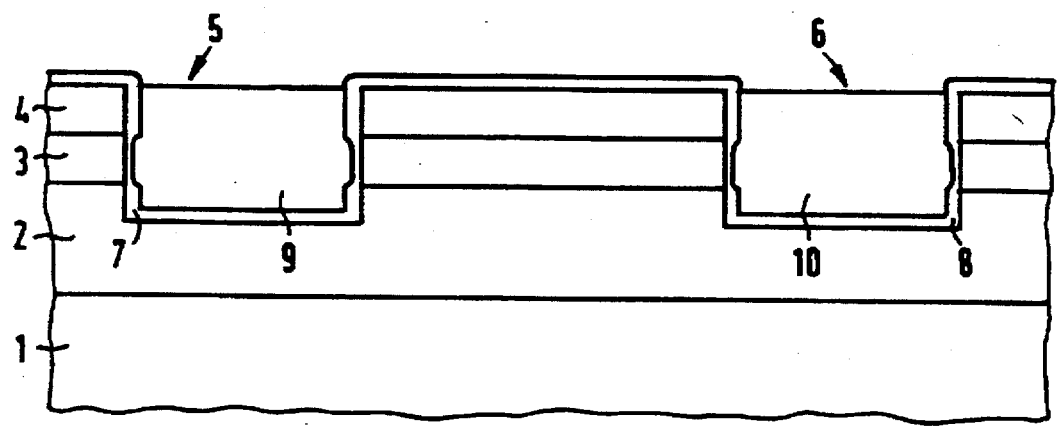
FIG. 2 is a side cross section which shows the silicon substrate after the formation of trenches which are each provided with gate dielectric and gate electrode for a selection transistor and a memory transistor.

Using a mask (not shown), a first trench 5 and a second trench 6 which each extend down into the first doped layer 2 (see FIG. 2) are produced by anisotropic etching. By thermal oxidation at 700° to 800° C., a first gate dielectric 7 composed of SiO$_2$ is produced at the walls and the floor of the first trench 5 and a second gate dielectric 8 composed of SiO$_2$ is produced at the walls and the floor of the second trench 6. Owing to the dopant concentration in the first doped layer 2, the second doped layer 3 and the third doped layer 4, the first gate dielectric 7 and the second gate dielectric 8 grow at the surface of the second doped layer 3 with a thickness which is in each case approximately one third less than at the surface of the first doped layer 2 and the third doped layer 4. By filling with polysilicon which is $n^+$-doped in situ, a first gate electrode 9 is produced in the first trench 5 and a second gate electrode 10 is produced in the second trench 6.

Figure 3:
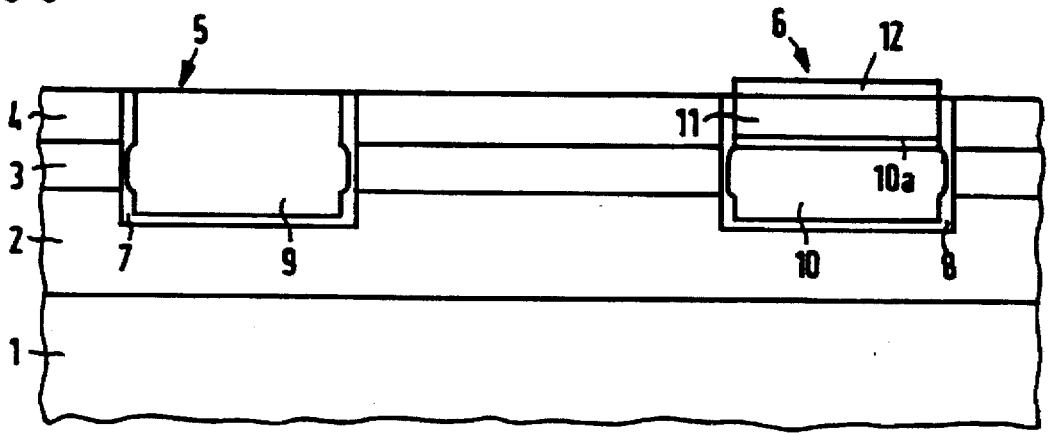
FIG. 3 is a side cross section which shows the silicon substrate after the formation of a diode structure.

The second gate electrode 10 is back-etched so that it terminates in height approximately at the level of the second doped layer 3 (see FIG. 3). In this process, the remaining surface is protected against etch attack by a mask (not shown). A diffusion-barrier layer 10a is applied to the second gate electrode 10. The diffusion-barrier layer 10a is formed from a very thin oxide layer having a thickness of, for example, 1 nm or a very thin silicide layer having a thickness of, for example, 2 nm. A doped polysilicon structure 11, which essentially fills the second trench, is then produced in the second trench 6 by filling it with p-type polysilicon doped in situ. The diffusion-barrier layer 10a on the surface of the second gate electrode 10 prevents an outdiffusion of the dopants of the doped polysilicon structure 11 into the second gate electrode 10.

Figure 4:
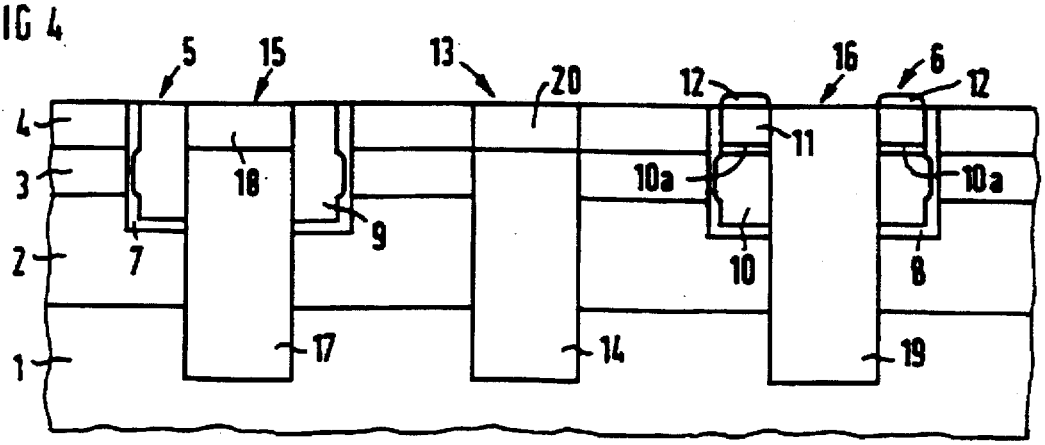
FIG. 4 is a side cross section which shows the silicon substrate after the formation of isolating trenches between the selection transistor and the memory transistor, and also with respect to adjacent memory cells.

To simplify the subsequent contacting, the doped polysilicon structure 11 is provided with a self-aligning metal silicide layer 12 as shown in FIG. 3. A third trench 13 as shown in FIG. 4, which extends down into the substrate 1, is produced between the first trench 5 and the second trench 6. The third trench 13 cuts through the first doped layer 2, the second doped layer 3 and also the third doped layer 4. The third trench 13 is provided with a first isolation structure 14 composed, for example, of SiO$_2$ and extending at least up to the height of the second doped layer 3 (see FIG. 4).

Simultaneously, a fourth trench 15 is produced inside the first trench 5 and a fifth trench 16 inside the second trench 6. The fourth trench 15 and the fifth trench 16 each extend down into the substrate 1 and in each case cut through the first doped layer 2 below the first trench 5 or second trench 6, respectively.

The fourth trench 15 is provided with a second isolation structure 17, for example, composed of SiO$_2$ which extends in height up into the first gate electrode 9. Free space left above the latter in the fourth trench 15 is filled with an $n^+$-doped polysilicon structure 18 which electrically interconnects parts of the first gate electrode 9 which are separated by the fourth trench 15.

The fifth trench 16 is provided with a third isolation structure 19 composed, for example, of $SiO_2$ and completely filling the fifth trench 16. The third isolation structure 19 in the fifth trench 16 cuts the second gate electrode 10, the diffusion-barrier layer 10a, the doped polysilicon structure 11 and the metal silicide layer 12 into two parts which are isolated from one another in each case.

In the third trench 13, an interconnect structure 20 which is composed, for example, of n-doped polysilicon and which electrically interconnects parts of the third doped layer 4 separated by the third trench 13 is produced above the first isolation structure 14. Preferably, the interconnect structure 20 terminates level with the surface of the third doped layer 4.

Those parts of the first doped layer 2, second doped layer 3, third doped layer 4, the first gate dielectric 7 and the first gate electrode 9 that are disposed between the third trench 13 and the fourth trench 15 form a selection transistor. Those parts of the first doped layer 2, second doped layer 3, third doped layer 4, the second gate dielectric 8 and the second gate electrode 10 that are disposed between the third trench 13 and the fifth trench 16 form a memory transistor. The selection transistor and the memory transistor have a common source/drain zone formed by the corresponding parts of the third doped layer 4 and the interconnect structure 20. Incidentally, the selection transistor and the memory transistor are separated from one another by the first isolation structure 14. The memory cell is bounded laterally by the fourth trench 15 and the fifth trench 16. Memory cells which are disposed in mirror-image fashion in each case but are otherwise of analogous structure adjoin the fourth trench 15 and the fifth trench 16.

The doped polysilicon structure 11 and the second gate electrode 10 form a $p-n^+$diode which, in this exemplary embodiment, forms a diode structure connected between the common source/drain zone 4, 20 and the second gate electrode 10. For the purpose of electrical connection between the $p-n^+$diode 10, 11, a polysilicon strip 21 (see FIG. 5) is produced which is, for example, n-doped and which is connected both to the surface of the metal silicide layer 12 and to the third doped layer 4 between the third trench 13 and the fifth trench 16 (see FIG. 5).

Figure 5:
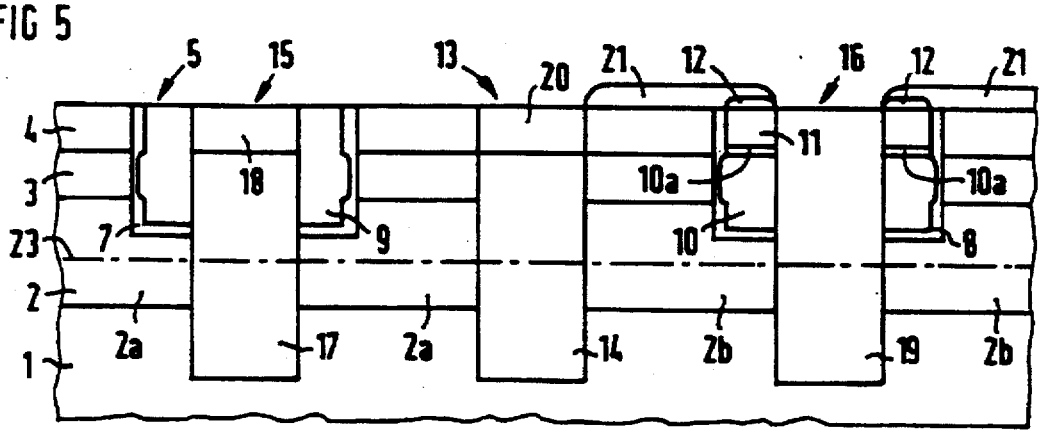
FIG. 5 is a side cross section which shows the silicon substrate after formation of an interconnect structure between the third doped zone and a diode structure.

The third trench 13, the fourth trench 15 and the fifth trench 16 extend through the entire memory cell arrangement perpendicularly to the plane of the drawing. Sixth trenches are produced which extend transversely to the third trench 13, the fourth trench 15 and the fifth trench 16 and which extend down into the first doped layer 2, for example 100 nm below the interface with the second doped layer 3, and which are filled with fourth isolation structures 22 (see FIG. 7). The sixth trenches extend, for example, at a right angle to the third trenches 13 outside the plane of the drawing shown in FIGS. 5 and 6. The depth of the sixth trenches is shown as a broken line 23 in FIGS. 5 and 6. The fourth isolation structure 22 isolates adjacent selection transistors or memory transistors along the third trench 13. At the same time, selection transistors disposed between the third trench 13 and the fourth trench 15 are electrically interconnected by that part of the first doped layer that is disposed between the third trench 13 and the fourth trench 15 and below the sixth trench 23 and that acts as bit line 2a as shown in FIG. 5.

Memory transistors disposed between the third trench 13 and the fifth trench 16 are electrically interconnected via that part of the second doped layer that is disposed between the third trench 13 and the fifth trench 16 below the sixth trench 23 and which forms a common supply line 2b.

Figure 6:
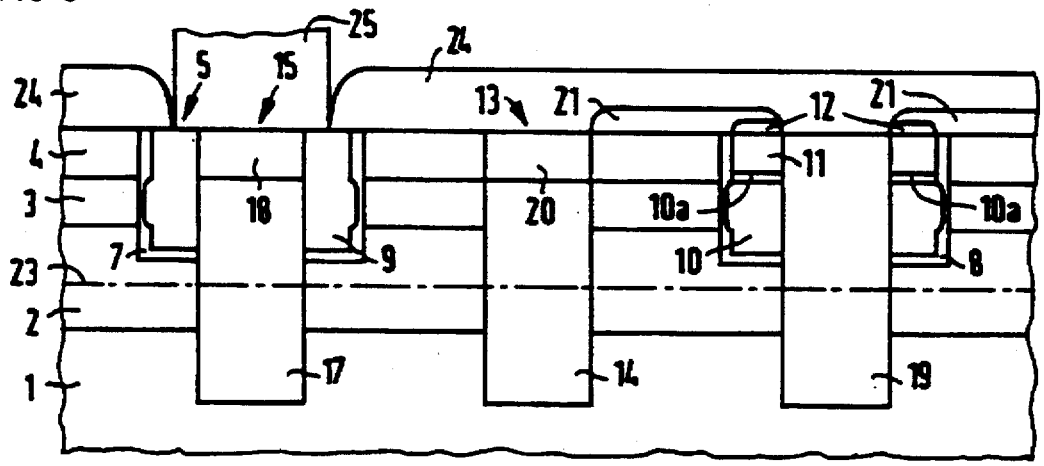
FIG. 6 is a side cross section which shows the silicon substrate after the formation of word-line contacts.

A passivation layer 24 as shown in FIG. 6, which is produced, for example, from $TEOS/SiO_2$, is applied over the entire surface. Vias to the first gate electrodes 9 are opened in the passivation layer 24 and are provided with a word-line contact 25 by filling with a suitable metal, for example tungsten. At the same time, the first gate electrodes 9 of adjacent memory cells disposed in the same first trench 5 are provided with a common word-line contact 25 (see FIG. 6). The word-line contacts 25 are interconnected, for example, with the aid of an aluminium metallization (not shown).

The buried bit lines 2a and the supply-voltage lines 2b are connected to appropriate voltages at spacings, which are substantially greater than the grid dimension of the memory cells, with the aid of vias.

Since the diode structure in this memory cell is formed as a p-n junction which is disposed as upper layer in each case in the second trench 6, the diode structure can be processed in planar manufacturing steps without the total area of the memory cell thereby being increased.

The area requirement of the memory cells produced by the production method according to the invention is furthermore minimized by the fact that the bit lines 2a and the supply-voltage lines 2b are buried in the layer structure. As a result, further interconnect levels for bit lines or feeding the supply voltage become superfluous.

Since adjacent memory cells disposed along the sixth trenches are in each case of mirror-symmetrical design, the buried bit lines 2a extend in bit-line pairs. In this design, therefore, both "open" and "folded" bit-line architectures may be formed.

As a departure from the example described above, an $SiO_2$ layer may be applied in a thickness of approximately 500 to 800 nm for the purpose of subsequent isolation of the transistors after the epitaxial application of the first doped layer 2. Holes for the active transistor zones which are filled in each case with the second doped layer and the third doped layer by selective epitaxy are etched in the $SiO_2$ layer. In this variant, the structured $SiO_2$ layer replaces the isolation structures 14, 17 and 19.

Figure 7:
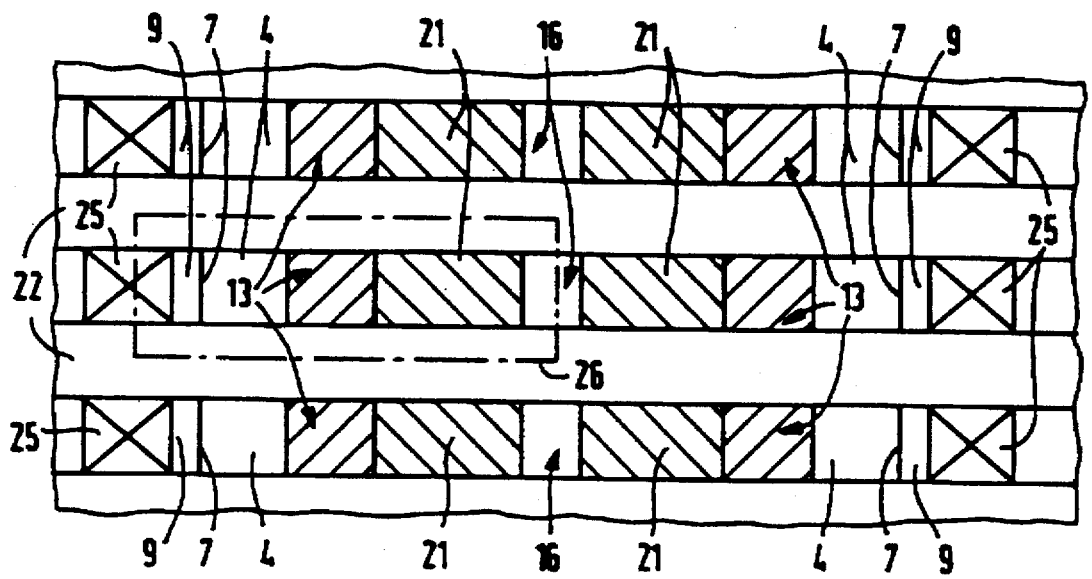
FIG. 7 is a plan view of a memory-cell arrangement produced according to the invention.

FIG. 7 shows a plan view of a memory-cell arrangement produced according to the invention. In this example, the sixth trenches filled in each case with the fourth isolation structure 22 extend perpendicularly to the third trenches 13. However, the trenches may also intersect at any other desired angle. Disposed alongside one another in each case between adjacent sixth trenches are a word-line contact 25 which belongs to two adjacent memory cells, the first gate electrode 9, the first gate dielectric 7, a part of the third doped silicon layer 4, the third trench 13, the doped polysilicon strip 21 and the fifth trench 16 which in turn belongs jointly to adjacent memory cells. The area of a single memory cell 26 is shown in FIG. 7 as a chain-dot line.

Figure 8:
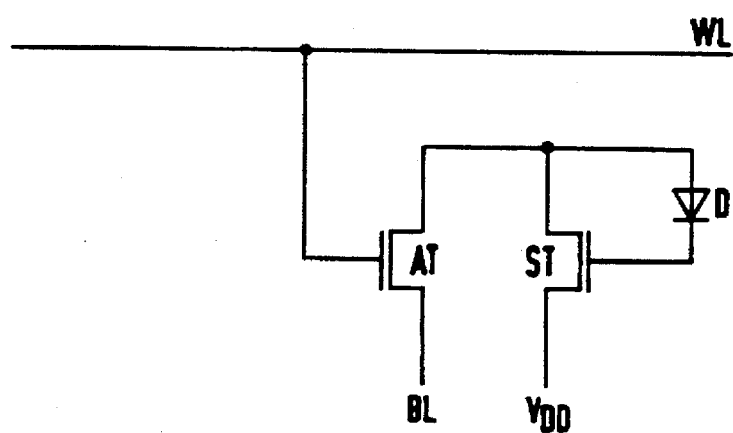
FIG. 8 is an equivalent circuit diagram of a memory cell produced by the method according to the invention.

FIG. 8 shows an equivalent circuit diagram of a memory cell. The memory cell comprises a selection transistor AT and a memory transistor ST which are connected in series between a bit line BL and a supply-voltage line $V_{DD}$ via a common source/drain zone. A diode structure D is connected between the common source/drain zone and the gate electrode of the memory transistor ST in such a way that a low resistance value occurs when a capacitance which is active at the gate electrode of the memory transistor charges and a high resistance value occurs when it discharges. The gate electrode of the selection transistor AT is connected to a word line WL. The operation of such a memory cell is described in International published patent application WO 92/01287 which claims a common priority with U.S. Pat. No. 5,327,374 and, to which reference is made in relation to the method of operation.

Although other modifications and changes may be suggested by those skilled in the art, it is the intention of the inventors to embody within the patent warranted hereon all changes and modifications as reasonably and properly come within the scope of their contribution to the art.

We claim:

1. A method of producing an arrangement containing self-amplifying dynamic MOS transistor memory cells, comprising the steps of;

providing a silicon substrate with a vertical sequence of doped zones which comprises at least a first doped zone a second doped zone disposed thereon and a third doped zone disposed thereon for a source zone, a channel zone and a drain zone of vertical MOS transistors, etching a first trench and a second trench down into the first zone and which traverse the second zone and the third zone, providing a surface of the first trench with a first gate dielectric and a surface of the second trench with a second gate dielectric, forming a first gate electrode in the first trench and forming a second gate electrode in the second trench, producing a third trench which cuts through the first doped zone, the second doped zone and the third doped zone between the first trench and the second trench, providing the third trench with a first isolation structure at least in a region of the first doped zone and of the second doped zone, electrically interconnecting parts of the third doped zone that are separated by the third trench by an interconnect structure, and producing a diode structure whose one terminal is connected in an electrically conducting manner to the third doped zone and whose other terminal is connected in an electrically conducting manner to that of the second gate electrode.

2. A method according to claim 1, further comprising the steps of:

doping the silicon substrate with a first conductivity type, said first doped zone being provided by epitaxially growing a silicon layer doped with a second conductivity type opposite to the first conductivity type on the silicon substrate, said second doped zone being provided by applying a silicon layer doped with the first conductivity type by one of low-pressure chemical vapour deposition epitaxy and molecular-beam epitaxy, and said third doped zone being provided by applying a silicon layer doped with the second conductivity type by one of LPCVD epitaxy and molecular-beam epitaxy.

3. A method according to claim 1, wherein the diode structure is formed as a Schottky diode.

4. A method according to claim 1, wherein the diode structure is formed as an $n^+$-p diode.

5. A method according to claim 4, wherein the second gate electrode is formed from doped polysilicon, a doped polysilicon structure is produced which, with the second gate electrode, is the diode structure, and the doped polysilicon structure is connected in an electrically conducting manner to the third doped zone.

6. A method according to claim 5, wherein the second gate electrode is produced in the second trench in a height essentially corresponding to the level of the second doped zone, the doped polysilicon structure is produced in the second trench above the second gate electrode, a surface of the doped polysilicon structure is provided with a metal silicide layer, a doped polysilicon strip is produced in which the metal silicide layer and the third doped zone overlap at least partly in each case.

7. A method according to claim 5, further comprising the step of, producing a diffusion-barrier layer between the second gate electrode and the doped polysilicon structure.

8. A method according to one of claims 1, wherein a dopant concentration in the first doped zone and in the third doped zone is in the range greater than or equal to $10^{19}$ cm$^{-3}$, a dopant concentration in the second doped zone is in the range less than or equal to $10^{18}$ cm$^{-3}$, the first gate dielectric and the second gate dielectric are formed by thermal oxidation at 700° to 800° C.

9. A method according to claim 1, wherein the interconnect structure is formed by the third trench composed of doped polysilicon of the same conductivity type as the third doped zone.

10. A method according to claim 1, further comprising the steps of:

forming a multiplicity of memory cells disposed in matrix fashion in the silicon substrate, the first trench, the second trench and the third trench are each formed as parallel strips, producing inside the first trench, a fourth trench which cuts through the first doped zone and in which a second isolation structure is formed which isolates at least parts of the first doped zone on either side of the fourth trench from one another, producing inside the second trench, a fifth trench which cuts through the first doped zone and in which a third isolation structure is formed which isolates parts of the first doped zone, the second gate electrode and the diode structure on either side of the fifth trench from one another, producing sixth trenches which cross the first trenches, the second trenches and third trenches, which extend down into the first doped zone without cutting through the first doped zone and which are filled with fourth isolation structures, producing word lines which extend parallel to the sixth trenches and which are connected in an electrically conducting manner to the first gate electrodes via word-line contacts, adjacent ones of said multiplicity of memory cells being arranged in a mirror-symmetrical manner along a word line, connecting a part of the first doped zone that is disposed between the first trench and the third trench as a bit line and that part of the first doped zone that is disposed between the third trench and the second trench as supply-voltage line.

* * * * *